(12) United States Patent
Sriram

(10) Patent No.: US 8,203,185 B2
(45) Date of Patent: Jun. 19, 2012

(54) SEMICONDUCTOR DEVICES HAVING VARYING ELECTRODE WIDTHS TO PROVIDE NON-UNIFORM GATE PITCHES AND RELATED METHODS

(75) Inventor: Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 1624 days.

(21) Appl. No.: 11/157,356

(22) Filed: Jun. 21, 2005

(65) Prior Publication Data

US 2006/0284261 A1 Dec. 21, 2006

(51) Int. Cl.
*H01L 29/76* (2006.01)

(52) U.S. Cl. ........... 257/369; 257/E29.12; 257/E29.127; 438/285

(58) Field of Classification Search .................. 257/469, 257/77, 192, 194, 197, 578, 579, 369, E29.12, 257/E29.127; 438/285
See application file for complete search history.

(56) References Cited

U.S. PATENT DOCUMENTS

| | | |
|---|---|---|
| 3,903,592 A | 9/1975 | Heckl |
| 4,732,871 A | 3/1988 | Buchmann et al. |
| 4,737,469 A | 4/1988 | Stevens |
| 4,757,028 A | 7/1988 | Kondoh et al. |
| 4,762,806 A | 8/1988 | Suzuki et al. |
| 4,803,526 A | 2/1989 | Terada et al. |
| 4,897,710 A | 1/1990 | Suzuki et al. |
| 4,947,218 A | 8/1990 | Edmond et al. |
| 5,229,625 A | 7/1993 | Suzuki et al. |
| 5,264,713 A | 11/1993 | Palmour |
| 5,270,554 A | 12/1993 | Palmour |
| 5,289,015 A | 2/1994 | Chirovsky et al. |
| 5,300,795 A | 4/1994 | Saunier et al. |
| 5,306,650 A | 4/1994 | O'Mara, Jr. et al. |
| 5,396,085 A | 3/1995 | Baliga |
| 5,399,883 A | 3/1995 | Baliga |
| 5,510,630 A | 4/1996 | Agarwal et al. |
| 5,686,737 A | 11/1997 | Allen |
| 5,719,409 A | 2/1998 | Singh et al. |
| 5,742,082 A | 4/1998 | Martinez et al. |
| 5,850,099 A | 12/1998 | Liu et al. |
| 5,869,856 A | 2/1999 | Kasahara |
| 5,891,769 A | 4/1999 | Liaw et al. |
| 5,895,939 A | 4/1999 | Ueno |
| 5,900,648 A | 5/1999 | Harris et al. |

(Continued)

FOREIGN PATENT DOCUMENTS

DE 19900169 A1 7/1999

(Continued)

OTHER PUBLICATIONS

*A 10 W 2 GHz Silicon Carbide MESFET*, Microwave Journal, Sep. 1999, pp. 232, 240, 242.

(Continued)

*Primary Examiner* — Colleen Matthews
(74) *Attorney, Agent, or Firm* — Myers Bigel Sibley & Sajovec

(57) ABSTRACT

Semiconductor devices including a plurality of unit cells connected in parallel are provided. Each of the unit cells have a first electrode, a second electrode and a gate finger. One of the first electrodes at a center of the semiconductor device has a first width and one of the first electrodes at a periphery of the semiconductor device has a second width, smaller than the first width. The second electrodes have a substantially constant width such that a pitch between the gate fingers is non-uniform. Related methods are also provided.

35 Claims, 5 Drawing Sheets

U.S. PATENT DOCUMENTS

| | | | |
|---|---|---|---|
| 5,925,895 | A | 7/1999 | Sriram et al. |
| 5,972,801 | A | 10/1999 | Lipkin et al. |
| 6,107,649 | A | 8/2000 | Zhao |
| 6,121,633 | A | 9/2000 | Singh et al. |
| 6,218,680 | B1 | 4/2001 | Carter, Jr. et al. |
| 6,316,793 | B1 | 11/2001 | Sheppard et al. |
| 6,534,857 | B1 | 3/2003 | Morse |
| 6,686,616 | B1 | 2/2004 | Allen et al. |
| 6,825,548 | B2 | 11/2004 | Fujioka et al. |
| 6,906,350 | B2 | 6/2005 | Sriram |
| 6,956,239 | B2 | 10/2005 | Sriram |
| 2003/0017660 | A1 | 1/2003 | Li |
| 2003/0075719 | A1 | 4/2003 | Sriram |
| 2005/0127399 | A1 | 6/2005 | Meadows |
| 2006/0006393 | A1 | 1/2006 | Ward et al. |

FOREIGN PATENT DOCUMENTS

| | | | |
|---|---|---|---|
| EP | 0 518 683 | A1 | 12/1992 |
| EP | 0 560 123 | A | 9/1993 |
| JP | 47-5124 | | 3/1972 |
| JP | 54155482 | A | 12/1979 |
| JP | 59134874 | A | 8/1984 |
| JP | 60142568 | A | 7/1985 |
| JP | 60154674 | A | 8/1985 |
| JP | 60189250 | A | 9/1985 |
| JP | 63047983 | A | 2/1988 |
| JP | 01059961 | A | 3/1989 |
| JP | 1106476 | | 4/1989 |
| JP | 1106477 | | 4/1989 |
| JP | 1196873 | | 8/1989 |
| JP | 1308876 | | 12/1989 |
| JP | 02010772 | A | 1/1990 |
| JP | 04225534 | A | 8/1992 |
| JP | 6310545 | A | 11/1994 |
| JP | 06-342803 | A | 12/1994 |
| JP | 09036359 | A | 2/1997 |
| JP | 11150124 | A | 6/1999 |
| JP | 2004-039657 | A | 2/2004 |
| JP | 2005-509295 | A | 4/2005 |
| WO | WO 98/19342 | | 5/1998 |
| WO | WO 01/67521 | A1 | 9/2001 |
| WO | WO 01/86727 | A2 | 11/2001 |

OTHER PUBLICATIONS

Allen, *Silicon Carbide MESFET's with 2W/mm and 50% P.A.E. at 1.8 GHz*, 1996.

Browne, Editorial: *The Power and the Glory*, Microwaves & RF, Jul. 1999, p. 17.

Browne, *SiC MESFET Delivers 10-W Power at 2GHZ*, Microwaves & RF, Oct. 1999, pp. 138-139.

Browne, *Top Products of 1999*, Microwaves &RF, Dec. 1999, pp. 223-233.

Carter et al., *Silicon Carbide and Related Materials, 1999, Part 2*, Materials Science Forum, vols. 338-342, pp. 1247-1266 (2000).

Evwaraye et al., "Examination of Electrical and Optical Properties of Vanadium in Bulk n-Type Silicon Carbide," *J. Appl. Phys.* vol. 76, No. 10, 1994.

*First Silicon Carbide Microwave Power Products Are Introduced*, Applied Microwave & Wireless, pp. 104.

Heftman, *Wireless Semi Technology Heads Into New Territory*, Microwaves & RF, Feb. 2000, pp. 31-38.

Hilton et al., *Suppression of Instabilities in 4H-SiC Microwave MESFETs*, 2000 8$^{th}$ IEEE International Symposium.

Hilton et al., *Surface Induced Instabilities in 4H-SiC Microwave MESFETs*, Materials Science Forum, vols. 338-342, 2000, pp. 1251-1254.

Jonsson et al., *Physical Simulations on the Operations of 4H-SiC Microwave Power Transistors*, Materials Science Forum, vols. 338-342, 2000, pp. 1263-1266.

Kelner et al., *β-SiC MESFET's and Buried-Gate JFET's*, IEEE Electron Device Letters, vol. EDL-8, No. 9, Sep. 1987, pp. 428-430.

Kong et al., *Temperature Dependence of the Current-Voltage Characteristics of Metal-Semiconductor Field-Effect Transistors in n-Type β-SiC Grown Via Chemical Vapor Deposition*, Appl. Phys Lett., vol. 51, No. 6, Aug. 10, 1987, pp. 442-444.

Konstantinov et al., High Performance Silicon Carbide MESFET Utilizing Lateral Epitaxy, Materials Science Forum, vols. 389-393, pp. 1375-1378.

Konstantinov et al., *Investigation of Lo-Hi-Lo and Delta-Doped Silicon Carbide Structures*, Mat. Res. Soc. Symp. Proc., vol. 640, 2001, pp. H2.4.1-H2.4.6.

Ma, et al., *High Efficiency LDMOS Power FET for Low Voltage Wireless Communications*, 1996 IEEE.

Nilsson et al., *Characterization of SiC MESFETs on Conducting Substrates*, Materials Science Forum, vols. 338-342, 2000, pp. 1255-1258.

Noblanc et al., *Power Density Comparison Between Microwave Power MESFET's Processed on Conductive and Semi-Insulating Wafer*, Materials Science Forum, vols. 338-342, 2000, pp. 1247-1250.

Palmour et al., *Characterization of Device Parameters in High-Temperature Metal-Oxide-Semiconductor Field Effect Transistors in β -SiC Thin Films*, J. Appl. Phys, vol. 64, No. 4, Aug. 15, 1988, pp. 2168-2177.

Palmour et al., *High-Temperature Depletion-Mode Metal-Oxide-Semiconductor Field Effect Transistors in Beta-SiC Thin Films*, Appl. Phys. Lett., vol. 51, No. 24, Dec. 14, 1987, pp. 2028-2030.

Palmour et al., *Ultrafast Silicon-Carbide Rectifiers*, Powertechnics Magazine, Aug. 1989, pp. 18-21.

Rorsman et al., *Fabrication, Characterization and Modeling of SiC MESFETs*, Materials Science Forum, vols. 338-342, 2000, pp. 12-59-1262.

*SiC MESFET Drives PCS Base Stations*, Wireless Systems Design, Oct. 1999, pp. 24.

Soares, ed., *GaAs MESFET Circuit Design*, Artech House, 1988, pp. 7-9, 17-18.

Sze, *Physics of Semiconductor Devices, Second Edition*, John Wiley & Sons, 1981, pp. 341-347.

Yokogawa et al., *Electronic Properties of Nitrogen Delta-Doped Silicon Carbide Layers*, Mat. Res. Soc. Symp. Proc., vol. 640, 2001, pp. H2.5.1-H2.5.6.

United States Patent Application entitled "Metal-Semiconductor Field Effect Transistors (MESFETs Having Drains Coupled to the Substrate and Methods of Fabricating the Same," U.S. Appl. No. 10/977,054, filed Oct. 29, 2004.

United States Patent Application entitled "Asymetric Layout Structures for Transistors and Methods of Fabricating the Same," U.S. Appl. No. 10/977,227, filed Oct. 29, 2004.

United States Patent Application entitled "Transistors Having Buried N-Type and P-Type Regions Beneath the Source Regions and Methods of Fabricating the Same," U.S. Appl. No. 11/012,553, filed Dec. 15, 2004.

Official Action, Japanese Patent Application No. 2008-518139, Feb. 1, 2012.

Communication pursuant to Article 94(3) EPC corresponding to EP Application No. 06 758 302.1 dated Nov. 2, 2010; 4 pages.

SEMICONDUCTOR DEVICES HAVING VARYING ELECTRODE WIDTHS TO PROVIDE NON-UNIFORM GATE PITCHES AND RELATED METHODS

FIELD OF THE INVENTION

The present invention relates microelectronic devices and more particularly to high power semiconductor devices.

BACKGROUND OF THE INVENTION

Electrical circuits requiring high power handling capability (>20 watts) while operating at high frequencies such as radio frequencies (500 MHz), S-band (3 GHz) and X-band (10 GHz) have in recent years become more prevalent. Because of the increase in high power, high frequency circuits there has been a corresponding increase in demand for transistors that are capable of reliably operating at radio frequencies and above while still being capable of handling higher power loads.

To provide increased power handling capabilities, transistors with a larger effective area have been developed. However, as the area of a transistor increases, the transistor may become less suitable for high frequency operations that, typically, require a small source to drain distance so that the carrier transit times are limited. One technique for increasing the area of a transistor while still providing for high frequency operations is to use a plurality of transistor cells that are connected in parallel. Such a configuration includes a plurality of elongated gate "fingers" which control the flow of current through each of the plurality of unit cells. Thus, the source to drain distance of each cell may be kept relatively small while still providing a transistor with increased power handling capability. Conventionally, when a plurality of parallel transistor cells are connected in parallel on a single chip, the cells are evenly spaced such that the gate-to-gate distance between adjacent cells (referred to herein as "pitch" or "gate pitch") is uniform from one cell to the next.

When such multi-cell transistors are used in high frequency operations, they may generate a large amount of heat. As a device heats up, performance of the device typically degrades. Such degradation may be seen in gain, linearity and/or reliability. Thus, efforts have been made to keep junction temperatures of the transistors below a peak operating temperature. Typically, heatsinks and/or fans have been used to keep the devices cool so as to ensure proper function and reliability. However, cooling systems may increase size, electrical consumption, manufacturing costs and/or operating costs of systems using such transistors.

With uniform pitch multi-cell transistors, the operating temperature of cells near the center of the array is typically greater than that of the cells at the periphery. This is generally the case because the cells at the periphery have a greater thermal gradient to areas surrounding the cells. Thus, for example, adjacent cells near the center of the multi-cell array will each generate heat and thus, each side of the cells will be at an elevated temperature with respect to cells farther from the center. This results in a thermal profile that is roughly a bell curve with center junction temperatures being the hottest and with the outer most junctions having a substantially reduced operating temperature compared to the center junctions.

An uneven temperature distribution among the junctions of a device may reduce device linearity. For example, for a device with a plurality of evenly spaced gate fingers connected by a manifold, RF phasing errors may occur along both the gate manifold and the individual gate fingers as a result of differing gate resistance as a function of temperature. Conventionally, to address these issues the spacing between the gate fingers is widened and/or the length of the fingers are shortened and additional fingers added to achieve the same net active area. Both of these solutions result in spreading the heat load generated in the center of the device over a wider area. These solutions also result in a larger area for the multi-cell transistor that may reduce the number of die per wafer.

A technique that attempts to solve the temperature distribution problem is discussed in U.S. Pat. No. 6,534,857 to Morse, entitled Thermally Balanced Power Transistor, the disclosure of which is hereby incorporated herein by reference as if set forth in its entirety. As discussed therein, the gate pitch is varied making it smaller for the end units compared to those in the center of the multi-cell array. However, this may lead to non-uniform widths of the source and drain fingers in the device and may cause the drain to source capacitance ($C_{ds}$) to be non-uniform, which may cause deterioration in device performance. Similar issues are discussed in commonly assigned U.S. patent application Ser. No. 10/734,398 filed Dec. 12, 2004, entitled Non-Uniform Gate Pitch Semiconductor Devices and U.S. patent application Ser. No. 10/977,227 filed Oct. 29, 2004, entitled Asymmetric Layout Structures for Transistors and Methods of Fabricating the Same, the disclosures of which are hereby incorporated herein by reference as if set forth in their entirety.

SUMMARY OF THE INVENTION

Some embodiments of the present invention provide semiconductor devices including a plurality of unit cells connected in parallel. Each of the unit cells have a first electrode, a second electrode and a gate finger. One of the first electrodes at a center of the semiconductor device has a first width and one of the first electrodes at a periphery of the semiconductor device has a second width, smaller than the first width. The second electrodes have a substantially constant width such that a pitch between the gate fingers is non-uniform.

In further embodiments of the present invention, the non-uniform pitch between the gate fingers may provide a substantially uniform junction temperature to a substantial majority of the gate fingers when in operation. The width of the second electrodes may be narrower than the first and second widths and a drain to source capacitance ($C_{ds}$) may remain substantially constant in the plurality of unit cells when in operation.

In still further embodiments of the present invention, the plurality of unit cells may include a plurality of unit cells arranged in a linear array. The pitch between the gate fingers may be inversely related to a distance of the gate finger from the center of the semiconductor device. The pitch between the gate fingers at the periphery of the semiconductor device may be less than a pitch between gate fingers at a center of the device.

In some embodiments of the present invention, the plurality of unit cells may include a plurality of metal semiconductor field effect transistor (MESFET) unit cells. The semiconductor device may include a silicon carbide (SiC) metal semiconductor field effect transistor (MESFET), a gallium arsenide (GaAs) MESFET or a gallium Nitride (GaN) high electron mobility transistor (HEMT). The plurality of unit cells may include a plurality of silicon carbide transistor unit cells or a plurality of gallium nitride transistor unit cells.

In further embodiments of the present invention, the first and second widths may be from about 20 μm to about 60 μm.

The non-uniform pitches between the gate fingers may be from about 10 μm to about 90 μm. The first electrodes may be source electrodes and the second electrodes may be drain electrodes.

Still further embodiments of the present invention provide field effect transistors (FETs) including a plurality of unit cells connected in parallel. Each of the unit cells include a source finger, a drain finger and a gate finger. One of the source fingers at a center of the FET has a first width and one the source fingers at a periphery of the FET has a second width, smaller than the first width. The drain fingers have a substantially constant width such that a pitch between the gate fingers is non-uniform. The non-uniform pitch between the gate fingers provides a substantially uniform junction temperature to a substantial majority of the gate fingers when in operation.

While the present invention is described above primarily with reference to semiconductor devices and FETs, other types of transistors as well as methods of fabricating semiconductor devices and, in particular, FETs are also provided.

DETAILED DESCRIPTION OF THE INVENTION

Figure 1:
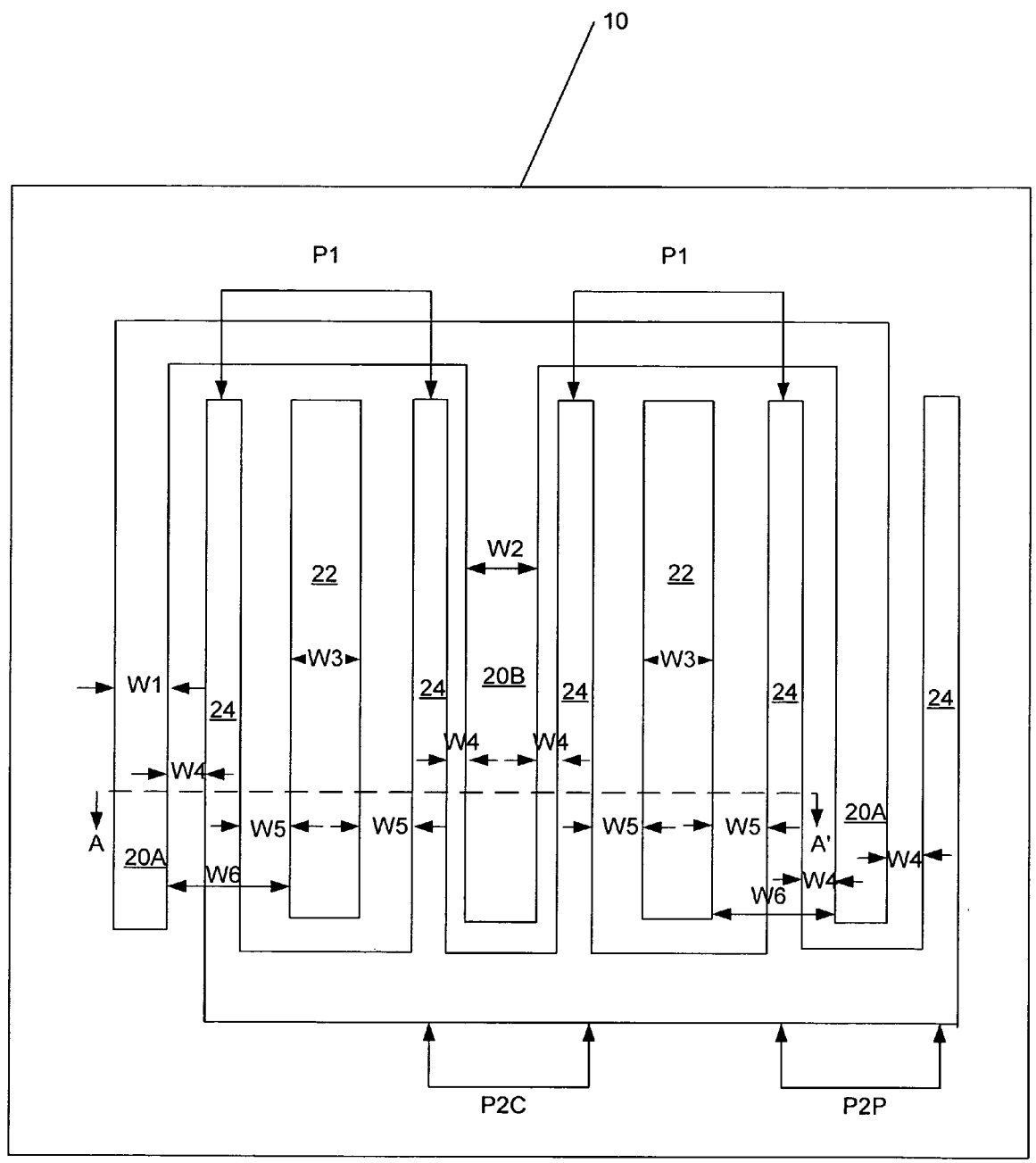
FIG. 1 is a plan view of a transistor according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents.

Embodiments of the present invention will now be described in detail below with reference to FIGS. 1 through 3E that illustrate various embodiments of the present invention and various processes of fabricating embodiments of the present invention. Transistors, for example, a metal-semiconductor field effect transistors (MESFETs), according to some embodiments of the present invention, may be thermally balanced and have a substantially constant drain to source capacitance ($C_{ds}$). In particular, in some embodiments of the present invention, a width of a source contact (finger) at a center of the device may be larger than a width of the source contact (finger) at a periphery of the device, while a width of a drain contact (finger) is kept substantially constant. Thus, a variation in pitch between the gate fingers of the device may be obtained by changing the width of the source finger, which may provide a substantially uniform junction temperature to a substantial majority of the gate fingers when in operation. Furthermore, since the $C_{ds}$ is mainly determined by the width of the narrower of the source or drain contact, keeping the narrow contact (drain contact) unchanged throughout the device may allow the $C_{ds}$ to remain substantially constant across the various cells of the device. Details with respect to embodiments of the present invention will be discussed further herein.

It will be understood that although embodiments of the present invention are discussed herein having a constant drain width and a varying source width, embodiments of the present invention are not limited to this configuration. For example, a width of the drain contact may be varied and a width of the source contact may be kept constant to obtain the variation in pitch without departing from the scope of the present invention.

Referring now to FIG. 1, a plan view of transistors, for example, silicon carbide (SiC) Metal Semiconductor Field Effect Transistors (MESFETs) according to some embodiments of the present invention will be discussed. While embodiments of the present invention are illustrated with reference to SiC MESFETs, the present invention should not be construed as limited to such devices. Thus, embodiments of the present invention may include other transistor devices having a plurality of unit cells. Embodiments of the present invention may be suitable for use in any semiconductor device where a more/relatively uniform junction temperature and a constant $C_{ds}$ are desired and multiple unit cells of the device are present. Thus, for example, embodiments of the present invention may be suitable for use in non-silicon carbide devices, such as gallium nitride (GaN), Gallium Arsenide (GaAs) and/or silicon (Si) devices without departing from the scope of the present invention.

As illustrated in FIG. 1, a plurality of unit cells are provided on a substrate 10. Each unit cell includes a first electrode or drain contact 22, a gate contact 24 and a second electrode or source contact 20A or 20B, the gate contacts 24 are situated between the source contacts 20A and 20B and the drain contacts 22. It will be understood that although embodiments of the present invention are discussed as having source contacts 20A and 20B with first and second widths W1 and W2, respectively, embodiments of the present invention are not limited to this configuration. For example, source contacts having three or more widths may be provided without departing from the scope of the present invention.

Referring again to FIG. 1, the source contacts 20A and 20B, the gate contacts 24 and the drain contacts 22 are interdigitated. A first width W1 of the source contacts 20A at the periphery of the device are narrower than a second width W2 of the source contacts 20B at the center of the device. Furthermore, a width W3 of the drain contacts 22 remains substantially constant throughout the device. Thus an average gate pitch ((P1+P2)/2) is larger at the center of the device than at the periphery of the device. In particular, ((P1+P2$_C$)/2) is larger than ((P1+P2$_P$)/2), where P2$_C$ is the pitch at the center of the device and P2$_P$ is the pitch at the periphery of the device. In some embodiments of the present invention, a pitch may be as small as 10 µm and an average pitch may be from about 20 µm to about 80 µm.

The non-uniform pitch provided by the variation in the width of the source contact may allow provision of a substantially uniform junction temperature to a substantial majority of the gate fingers when in operation. Furthermore, as discussed above, the $C_{ds}$ of the device is typically determined based on the narrower of the source or drain contact. Thus, according to some embodiments of the present invention the width W3 of the drain contact 22 is narrower than the first width W1 of source contacts 20A and the second width W2 of the source contacts 20B.

As further illustrated in FIG. 1, a width W4 between source contacts 20A and 20B and gate contacts 24, a width W5 between gate contacts 24 and drain contacts 22 and a width W6 between source contacts 20A and 20B and drain contacts 22 may be different so as to allow the pitch to be non-uniform. The width W4 may be from about 0.4 µm to about 1.0 µm, the width W5 may be from about 1.2 µm to about 3.0 µm and the width W6 will be from about 2.0 µm to about 5.0 µm.

While embodiments of the present invention illustrated in FIG. 1 include five gate electrodes (fingers) 24, three source electrodes 20A and 20B and two drain electrodes 22, other numbers of these electrodes may be used. Furthermore, other MESFET or semiconductor device configurations may also be utilized. For example, devices such as those described in U.S. Pat. Nos. 4,762,806; 4,757,028; 5,270,554; 5,925,895 and 6,686,616, the disclosures of which are incorporated herein as if set forth fully, may be utilized in embodiments of the present invention. Also devices such as those described in commonly assigned U.S. patent application Ser. No. 10/136,456, filed Oct. 24, 2001 entitled DELTA DOPED SILICON CARBIDE METAL-SEMICONDUCTOR FIELD EFFECT TRANSISTORS HAVING A GATE DISPOSED IN A DOUBLE RECESS STRUCTURE; Ser. No. 10/304,272, filed Nov. 26, 2002 entitled TRANSISTORS HAVING BURIED P-TYPE LAYERS BENEATH THE SOURCE REGION; Ser. No. 10/977,054, filed on Oct. 29, 2004 entitled METAL-SEMICONDUCTOR FIELD EFFECT TRANSISTORS (MESFETS) HAVING DRAINS COUPLED TO THE SUBSTRATE AND METHODS OF FABRICATING THE SAME; Ser. No. 10/977,227, filed on Oct. 29, 2004 entitled ASYMETRIC LAYOUT STRUCTURES FOR TRANSISTORS AND METHODS OF FABRICATING THE SAME; and Ser. No. 11/012,553, filed on Dec. 15, 2004 entitled TRANSISTORS HAVING BURIED N-TYPE AND P-TYPE REGIONS BENEATH THE SOURCE REGIONS AND METHODS OF FABRICATING THE SAME, the disclosures of which are incorporated herein as if set forth fully, may be used in combination with embodiments of the present invention. However, embodiments of the present invention are not limited to MESFETs but may be utilized with other devices having an array of controlling electrodes and, in certain embodiments, a linear array of controlling electrodes.

In some embodiments of the present invention, the device may be a SiC MESFET as discussed with respect to FIG. 1. The pitch between the gate fingers 24 varies from a small pitch to a larger pitch toward the center of the device. By increasing the pitch at the center of the device, the increased heat dissipation area may compensate for the decreased thermal gradient at the center of the device such that the junction temperature associated with the respective gate fingers may be moderated. A more uniform junction temperature may provided for a decreased peak junction temperature which may result in improved reliability over a conventional uniform spaced device under the same operating conditions.

Furthermore, the more uniform thermal profile may reduce impedance differences between the fingers and, thereby, improve linearity of an RF device.

Figure 2:
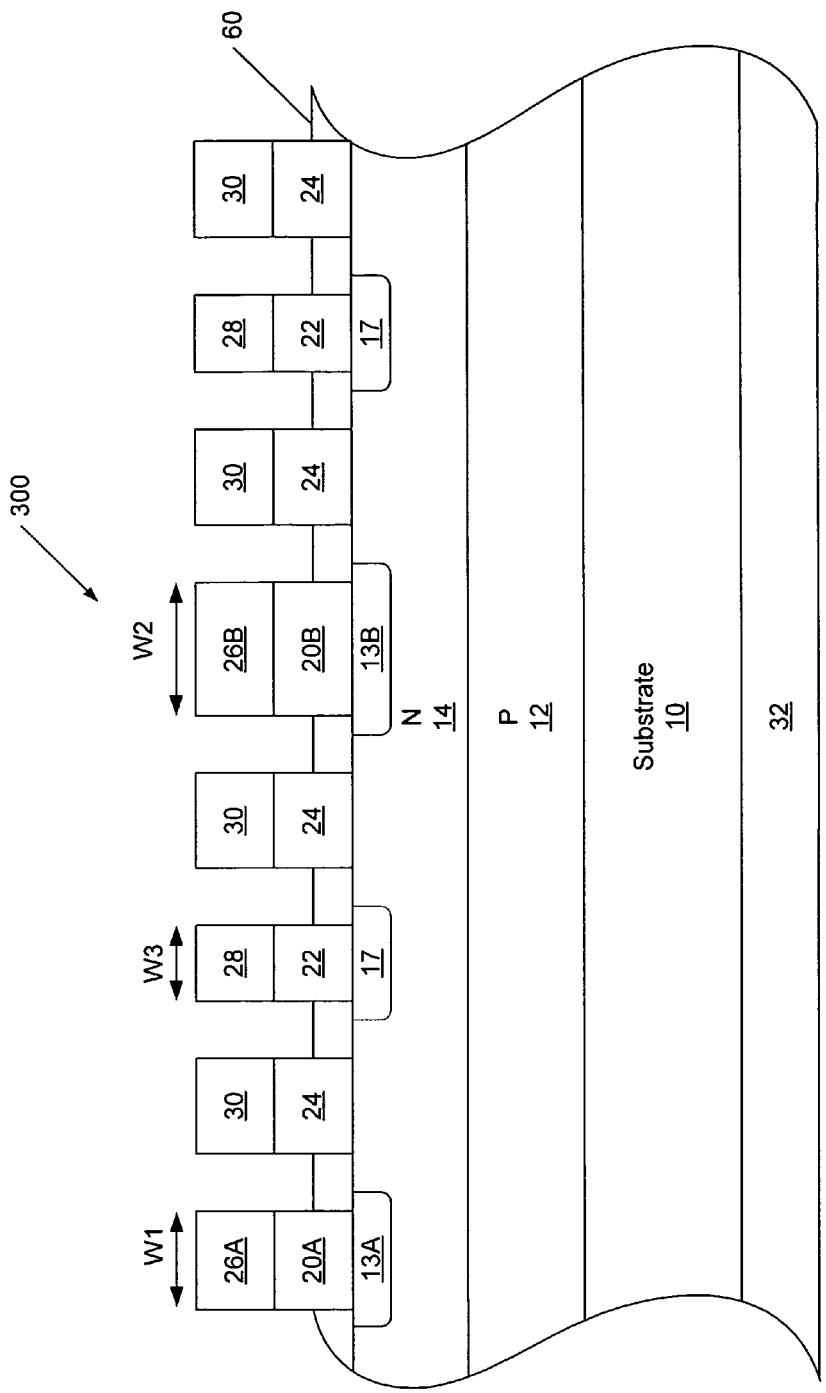
FIG. 2 is cross section of a portion of a multi-cell transistor taken along the line A-A' of FIG. 1.

Referring now to FIG. 2, a cross-section of transistors taken along the A-A' of FIG. 1 according to some embodiments of the present invention will be discussed. As illustrated in FIG. 2, an exemplary portion of a MESFET incorporating embodiments of the present invention may include a first epitaxial layer 12 of p-type conductivity provided on a single crystal bulk silicon carbide substrate 10 of either p-type or n-type conductivity or semi-insulating. The substrate 10 may, for example, include 6H, 4H, 15R or 3C silicon carbide. The first epitaxial layer of silicon carbide 12 is disposed between the substrate 10 and an n-type epitaxial layer 14. An optional metallization layer 32 may be formed on the backside of the substrate 10, opposite the first epitaxial layer 12.

The first epitaxial layer 12 may be a p-type conductivity silicon carbide epitaxial layer, an undoped silicon carbide epitaxial layer or a very low doped n-type conductivity silicon carbide epitaxial layer. If a low doped silicon carbide epitaxial layer is utilized, then in certain embodiments, the doping concentration of the first epitaxial layer 12 is less than about $5 \times 10^{15}$ cm$^{-3}$. If an undoped (not intentionally doped) or n-type first epitaxial layer 12 is utilized, then in certain embodiments, the substrate 10 may be a semi-insulating silicon carbide substrate. If an undoped or n-type first epitaxial layer 12 is utilized, a high quality channel layer may be formed without the buffer layer having any significant electrical effect on the transistor.

As further illustrated in FIG. 2, n$^+$ regions 13A, 13B and 17 are provided that respectively define the source regions and the drain regions of the device. As used herein, "p$^+$" or "n$^+$" refer to regions that are defined by higher carrier concentrations than are present in adjacent or other regions of the same or another layer or substrate. The source and drain regions 13A, 13B and 17 are typically of n-type conductivity silicon carbide and have carrier concentrations that are greater than the carrier concentration of the first epitaxial layer 14. For the source and drain regions 13A, 13B and 17, carrier concentrations of about $1 \times 10^{19}$ cm$^{-3}$ may be suitable, but carrier concentrations as high as possible are preferred.

Ohmic contacts 20A, 20B and 22 may be formed on the second epitaxial layer 14 and are spaced apart so as to provide source contacts (fingers) 20A and 20B and drain contacts (fingers) 22. As illustrated ohmic contacts 20A, 20B and 22 may be provided on the implanted source and drain regions 13A, 13B and 17, respectively. Schottky gate contacts 24, also referred to as gate fingers, are formed on the second epitaxial layer 14 between the source contacts 20 and the drain contacts 22. As illustrated, optional metal overlayers 26A, 26B, 28 and 30 are formed on the source contacts 20A and 20B, the drain contacts 22 and the Schottky gate contacts 24. A passivation layer 60 may also be provided. As illustrated in FIG. 3, certain embodiments of the present invention provide a linear array of cells that are connected in parallel. Thus, the gate contacts 24 may be connected in parallel in a third dimension.

The gate contact 24 may be formed of chromium, platinum, platinum silicide, nickel, and/or TiWN, however, other metals such as gold, known to one skilled in the art to achieve the Schottky effect, may be used. The Schottky gate contact 24 typically has a three layer structure. Such a structure may have advantages because of the high adhesion of chromium (Cr). For example, the gate contact 24 can optionally include a first gate layer of chromium (Cr) contacting the second epitaxial layer 14. The gate contact 24 may further include an overlayer of platinum (Pt) and gold 30 or other highly conductive metal.

As is further illustrated in FIG. 2, the source contacts 20A at the periphery of the device 300 have a first width W1 and the source contacts 20B at the center of the device 300 have a second width W2, larger than the first width W1. Furthermore, a width W3 of the drain contacts 22 remains substantially constant throughout the device and in some embodiments of the present invention is smaller than both the first W1 and second W2 widths of the source contacts 20A and 20B. Accordingly, as discussed above with respect to FIG. 1, the variation in width of the source contacts 20A and 20B may provide non-uniform pitches between the gate fingers 24. Furthermore, the $C_{ds}$ may remain substantially constant as the drain contacts 22 are narrower than the source contacts 20A and 20B and remain substantially constant throughout the device.

As used herein "a non-uniform gate pitch" refers to a pitch between gate fingers 24 being larger at the center of the device compared to the periphery of the device. The non-uniform gate pitch may provide a substantially uniform junction temperature for a substantial majority of the gate fingers of a device. In still further embodiments of the present invention, a substantially uniform junction temperature is provided for all of the gate fingers. As further used herein, the $C_{ds}$ remains "substantially constant" if the $C_{ds}$ varies less than about 2.0 percent between cells.

As discussed above, embodiments of the present invention may provide a linear (single dimension) array of cells having a non-uniform gate pitch of a predefined pattern. It will be understood that embodiments of the present invention are not limited to linear arrays of cells. For example, embodiments of the present invention may be provided in two dimensions.

Figure 3A:
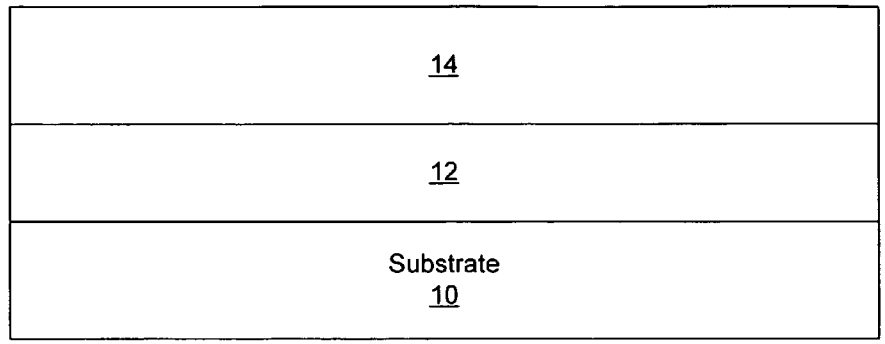
FIGS. 3A to 3E are cross sections illustrating processing steps in the fabrication of transistors according to embodiments of the present invention illustrated in FIGS. 1 through 2.

Processing steps in the fabrication of transistors according to some embodiments of the present invention illustrated in FIGS. 1 through 2 will now be discussed with respect to FIGS. 3A through 3E. As illustrated in FIG. 3A, a first epitaxial layer 12 may be grown or deposited on a substrate 10. The substrate 10 may be a semi-insulating substrate, a p-type substrate or an n-type substrate. The substrate 10 may be very lightly doped. If the substrate 10 is semi-insulating it may be fabricated as described in commonly assigned U.S. Pat. No. 6,218,680 to Carter et al. entitled "Semi-insulating Silicon Carbide Without Vanadium Domination", the disclosure of which is hereby incorporated by reference herein as if set forth in its entirety. Other techniques for providing semi-insulating substrates may also be used. The buffer layer 12 may be of p-type conductivity silicon carbide having a carrier concentration of about $3.0 \times 10^{15}$ cm$^{-3}$ or less, but typically $1.0 \times 10^{15}$ cm$^{-3}$ or less. Alternatively, the buffer layer 12 may be n-type silicon carbide or undoped (not intentionally doped) silicon carbide. As further illustrated in FIG. 3A, a second epitaxial layer 14 is grown or deposited on the first epitaxial layer 12.

Figure 3B:
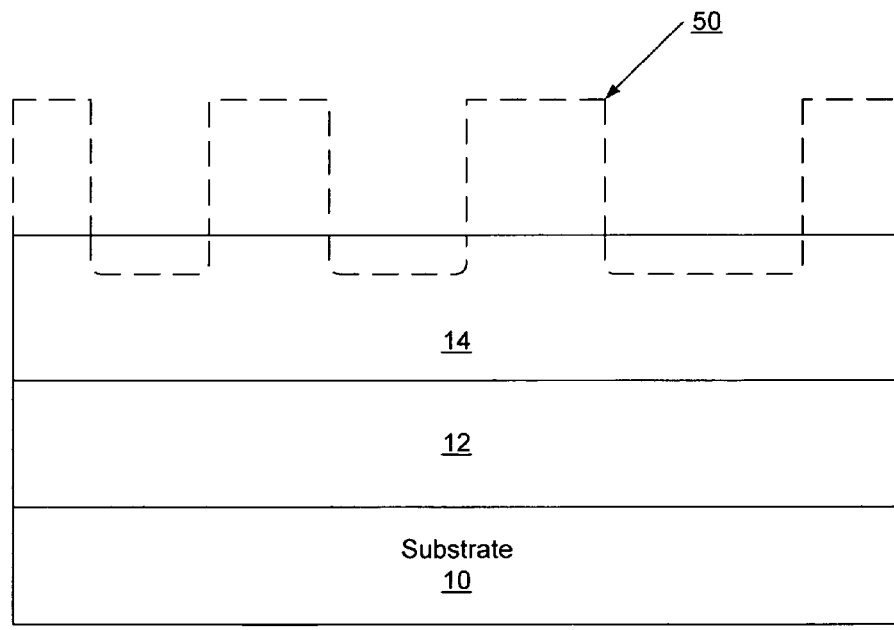
Figure 3C:
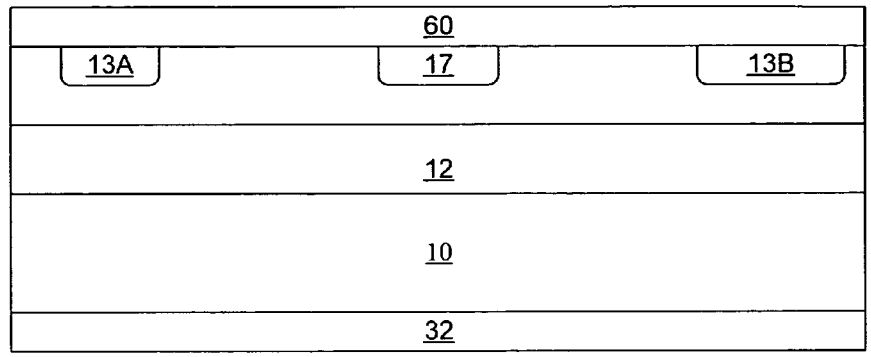

As illustrated in FIG. 3B, a mask 50 may be formed for implanting n$^+$ regions 13A, 13B and 17 that respectively define first and second source regions and a drain region. The source and drain regions 13A, 13B and 17 are typically formed by ion implantation of, for example, nitrogen (N) or phosphorus (P), followed by a high temperature anneal. Suitable anneal temperatures may be from about 1100 to about 1600° C. The ion implantation may be performed on the regions which are not covered by the mask 50 to form n$^+$ regions 13A, 13B and 17 as illustrated in FIG. 3C. Thus, the ions are implanted in portions of the second epitaxial layer 14 to provide highly doped regions of n-type conductivity, for example, n-type conductivity SiC, having higher carrier concentrations greater than the second epitaxial layer 14. Once implanted, the dopants may be annealed to activate the implant.

As illustrated in FIG. 3C, an insulator layer 60, for example, an oxide layer, may be provided on a surface of the device. The insulator layer 60 may be grown or deposited over the exposed surface of the existing structure, i.e. on the source and drain regions 13A, 13B and 17 and the second epitaxial layer 14. It will be understood that in some embodiments of the present invention a mesa may be provided around the perimeter of the MESFET. The mesa may have sidewalls defined by the substrate 10, the first epitaxial layer 12 and the second epitaxial layer 14 that define the periphery of the transistor. The mesa may extend past the depletion region of the device to confine current flow in the device to the mesa and reduce the capacitance of the device. The mesa may be formed by reactive ion etching the above described device, however, other methods known to one skilled in the art may be used to form the mesa. Furthermore, if a mesa is not utilized the device may be isolated using other methods such as proton bombardment, counterdoping with compensating atoms or other methods known to those skilled in the art.

Figure 3D:
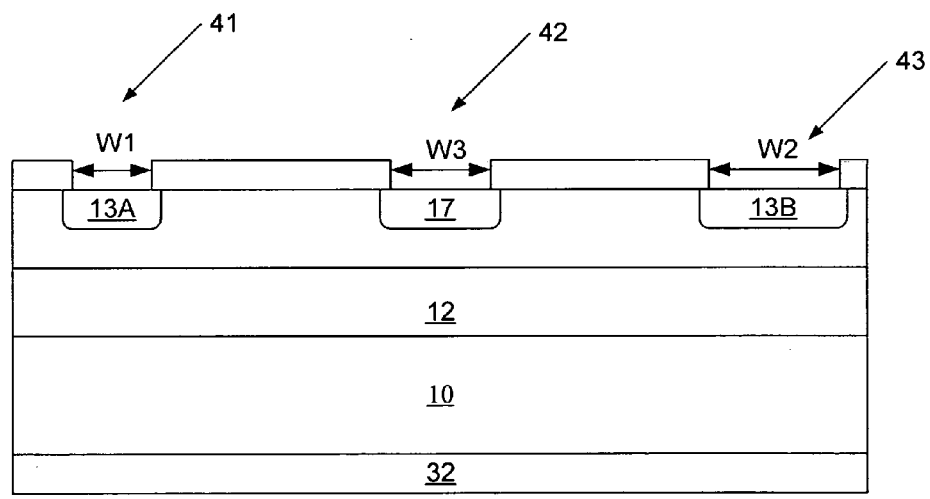
Figure 3E:
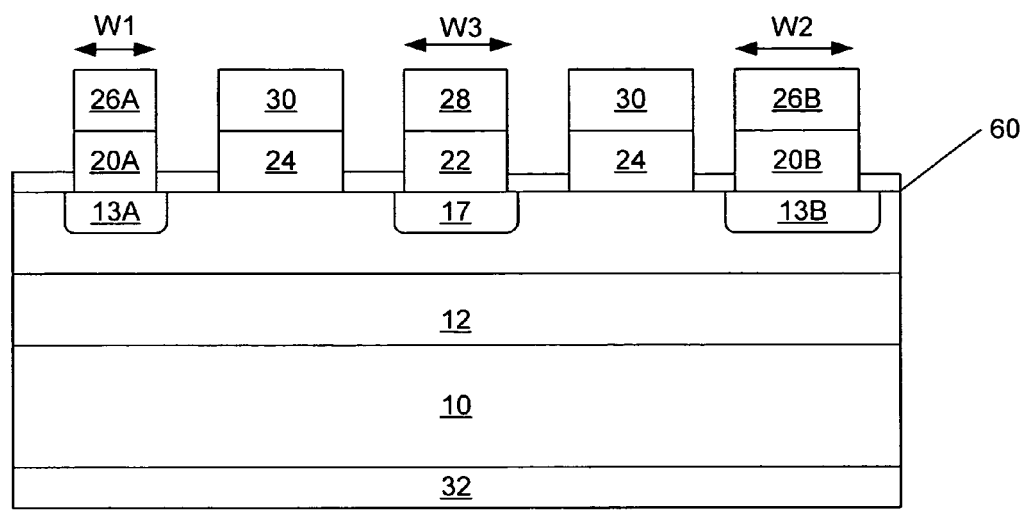

Referring now to FIG. 3D, contact windows 41, 42 and 43 may be etched through the insulator layer 60 to expose a portion of a surface of the source regions 13A and 13B and drain region 17. Nickel may then be evaporated to deposit the source and drain contacts 20A, 20B and 22, respectively. The nickel may be annealed to form the ohmic contacts 20A, 20B and 22 as illustrated in FIG. 3E. Such a deposition and annealing process may be carried out utilizing conventional techniques known to those of skill in the art. For example, the ohmic contacts 20A, 20B and 22 may be annealed at a temperature of from about 650° C. to about 1200° C. for about 2 minutes. However, other times and temperatures may also be utilized. Times from about 30 seconds to about 10 minutes may be, for example, acceptable.

FIG. 3E illustrates the formation of the gate contact 24 and the overlayers 26A, 26B, 28 and 30. For example, a contact window (not shown) may be opened an insulator 60 and a layer of chromium may be deposited in the window. Typically, the chromium layer is formed by evaporative deposition. The gate structure may then be completed by deposition of platinum and gold. As will also be appreciated by those of skill in the art, the overlayers 26A, 26B and 28 may be formed either before or after formation of the gate structure. In fact, if a titanium/platinum/gold structure is utilized, the platinum and gold portions of the overlayers may be formed in the same processing steps as the platinum and gold portions 30 of the gate structure. Accordingly, the overlayers 26A, 26B and 28 may be formed prior to the formation of a gate contact or after the formation of a gate contact. As further illustrated, a substrate contact 32 may be provided on the backside of the substrate 10.

In some embodiments of the present invention, the ohmic contacts may be the same or similar to contacts discussed in commonly assigned U.S. patent application Ser. No. 10/884,930, filed Jul. 6, 2004, entitled Silicon-Rich Nickel Silicide Ohmic Contacts for SiC Semiconductor Devices, the disclosure of which is incorporated herein by reference as if set forth in its entirety.

As further illustrated in FIG. 3E, the source contacts 20A at the periphery of the device have a first width W1 and the source contacts 20B at the center of the device have a second width W2, larger than the first width W1. Furthermore, a width W3 of the drain contacts 22 remains substantially constant throughout the device and in some embodiments of the present invention is smaller than both the first W1 and second W2 widths of the source contacts 20A and 20B. Accordingly, as discussed above, the variation in width of the source contacts 20A and 20B may provide non-uniform pitches between the gates 24. Furthermore, the $C_{ds}$ may remain substantially constant as the drain contacts 22 are narrower than the source contacts 20A and 20B and remain substantially constant throughout the device.

Although embodiments of the present invention are discussed herein as having source contacts with varying widths, embodiments of the present invention are not limited to this configuration. For example, in further embodiments of the present invention, the drain contacts may have varying widths without departing from the teachings of the present invention.

In some embodiments of the present invention, one of the source contact or the drain contact may be split into first and second portions exposing a surface of the substrate between the contact portions. The absence of metal between the contact portions, may provide a further reduced $C_{ds}$ and also allow the temperature of the device to be maintained. Details with respect to these embodiments of the present invention are discussed in U.S. patent application Ser. No. 10/977,227, filed on Oct. 29, 2004 entitled ASYMETRIC LAYOUT STRUCTURES FOR TRANSISTORS AND METHODS OF FABRICATING THE SAME, the disclosure of which has been incorporated herein by reference as if set forth in its entirety.

While embodiments of the present invention are discussed herein with reference to SiC MESFETs, the present invention should not be construed as limited to such devices. Embodiments of the present invention may be suitable for use in any semiconductor device where a more/relatively uniform junction temperature is desired or a peak junction temperature is to be maintained without a substantial increase in drain to source capacitance ($C_{ds}$) and multiple unit cells of the device are present. Thus, for example, embodiments of the present invention may be suitable for use in non-silicon carbide devices, such as gallium nitride (GaN), gallium arsenide (GaAs) and/or silicon (Si) devices. Accordingly, embodiments of the present invention may provide, for example, SiC MESFETs, SiC MESFET MMICs, GaN HEMTs, GaN HEMT MMICs, GaAs MESFETs, GaAs MESFET MMICs, GaAs HEMTs, GaAs HEMT MMICs, GaAs pHEMTs, GaAs pHEMT MMICs and the like.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor device comprising:
    a plurality of unit cells connected in parallel, each of the unit cells having a first electrode, a second electrode and a gate finger, wherein at least one of the first electrodes at a center of the semiconductor device has a first width, at least one of the first electrodes at a periphery of the semiconductor device has a second width, smaller than the first width, and the second electrodes have a substantially constant width such that a pitch between the gate fingers is non-uniform.

2. The semiconductor device of claim 1, wherein the non-uniform pitch between the gate fingers provides a substantially uniform junction temperature to a substantial majority of the gate fingers when in operation.

3. The semiconductor device of claim 1, wherein the width of the second electrodes are narrower than the first and second widths and wherein a drain to source capacitance ($C_{ds}$) remains substantially constant in the plurality of unit cells when in operation.

4. The semiconductor device of claim 1, wherein the plurality of unit cells comprise a plurality of unit cells arranged in a linear array.

5. The semiconductor device of claim 1, wherein the pitch between the gate fingers is inversely related to a distance of the gate finger from the center of the semiconductor device.

6. The semiconductor device of claim 1, wherein the pitch between the gate fingers at the periphery of the semiconductor device is less than a pitch between gate fingers at a center of the device.

7. The semiconductor device of claim 1, wherein the plurality of unit cells comprise a plurality of metal semiconductor field effect transistor (MESFET) unit cells.

8. The semiconductor device of claim 1, wherein the semiconductor device comprises a silicon carbide (SiC) metal semiconductor field effect transistor (MESFET), a gallium arsenide (GaAs) MESFET or a gallium Nitride (GaN) high electron mobility transistor (HEMT).

9. The semiconductor device of claim 1, wherein the plurality of unit cells comprise a plurality of silicon carbide transistor unit cells or a plurality of gallium nitride transistor unit cells.

10. The semiconductor device of claim 1, wherein the first and second widths may be from about 20 µm to about 60 µm.

11. The semiconductor device of claim 1, wherein the non-uniform pitches between the gate fingers are from about 10 µm to about 90 µm.

12. The semiconductor device of claim 1, wherein the first electrodes comprise source electrodes and the second electrodes comprise drain electrodes.

13. A field effect transistor (FET), comprising:
a plurality of unit cells connected in parallel, each of the unit cells having a source finger, a drain finger and a gate finger, wherein at least one of the source fingers at a center of the FET has a first width, at least one the source fingers at a periphery of the FET has a second width, smaller than the first width, and the drain fingers have a substantially constant width such that a pitch between the gate fingers is non-uniform, wherein the non-uniform pitch between the gate fingers provides a substantially uniform junction temperature to a substantial majority of the gate fingers when in operation.

14. The FET of claim 13, wherein the width of the drain fingers is narrower than the first and second widths and wherein a drain to source capacitance ($C_{ds}$) remains substantially constant in the plurality of unit cells when in operation.

15. The FET of claim 13, wherein the plurality of unit cells comprise a plurality of unit cells arranged in a linear array.

16. The FET of claim 13, wherein the pitch between the gate fingers is inversely related to a distance of the gate finger from the center of the transistor.

17. The FET of claim 13, wherein the pitch between the gate fingers at the periphery of the transistor is less than a pitch between gate fingers at a center of the device.

18. The FET of claim 13, wherein the plurality of unit cells comprise a plurality of metal semiconductor field effect transistor (MESFET) unit cells.

19. The FET of claim 13, wherein the metal semiconductor field effect transistor (MESFET) comprises a silicon carbide (SiC) MESFET, a gallium arsenide (GaAs) MESFET or a gallium Nitride (GaN) high electron mobility transistor (HEMT).

20. The FET of claim 13, wherein the plurality of unit cells comprise a plurality of silicon carbide transistor unit cells or a plurality of gallium nitride transistor unit cells.

21. The FET of claim 13, wherein the first and second widths may be from about 20 µm to about 60 µm.

22. The FET of claim 13, wherein the non-uniform pitches between the gate fingers are from about 10 µm to about 90 µm.

23. A method of controlling a peak junction temperature in a semiconductor device having a plurality of gate fingers electrically connected in parallel, the method comprising varying widths of source fingers and keeping widths of drain fingers substantially constant such that a spacing between the gate fingers is non-uniform.

24. The method of claim 23, wherein the spacing between the gate fingers in a central region of the device are spaced farther apart from adjacent gates than are gate fingers in a peripheral region of the device.

25. A method of forming a transistor comprising:
forming a plurality of unit cells connected in parallel, each of the unit cells having a source finger, a drain finger and a gate finger, wherein at least one of the source fingers at a center of the transistor has a first width, at least one of the source fingers at a periphery of the transistor has a second width, smaller than the first width, and the drain fingers have a substantially constant width such that a pitch between the gate fingers is non-uniform.

26. The method of claim 25, wherein the non-uniform pitch between the gate fingers provides a substantially uniform junction temperature to a substantial majority of the gate fingers when in operation.

27. The method of claim 25, wherein the width of the second electrodes are narrower than the first and second widths and wherein a drain to source capacitance ($C_{ds}$) remains substantially constant in the plurality of unit cells when in operation.

28. The method of claim 25, wherein the plurality of unit cells comprise a plurality of unit cells arranged in a linear array.

29. The method of claim 25, wherein the pitch between the gate fingers is inversely related to a distance of the gate finger from the center of the transistor.

30. The method of claim 25, wherein the pitch between the gate fingers at the periphery of the transistor is less than a pitch between gate fingers at a center of the device.

31. The method of claim 25, wherein the plurality of unit cells comprise a plurality of metal semiconductor field effect transistor (MESFET) unit cells.

32. The method of claim 25, wherein the metal semiconductor field effect transistor (MESFET) comprises a silicon carbide (SiC) MESFET, a gallium arsenide (GaAs) MESFET or a gallium Nitride (GaN) high electron mobility transistor (HEMT).

33. The method of claim 25, wherein the plurality of unit cells comprise a plurality of silicon carbide transistor unit cells or a plurality of gallium nitride transistor unit cells.

34. The method of claim 25, wherein the first and second widths may be from about 20 µm to about 60 µm.

35. The method of claim 25, wherein the non-uniform pitches between the gate fingers are from about 10 µm to about 90 µm.

* * * * *